(12) United States Patent
Riedlinger

(10) Patent No.: US 6,539,466 B1
(45) Date of Patent: Mar. 25, 2003

(54) SYSTEM AND METHOD FOR TLB BUDDY ENTRY SELF-TIMING

(75) Inventor: Reid James Riedlinger, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/510,276

(22) Filed: Feb. 21, 2000

(51) Int. Cl.[7] .................. G06F 12/10; G11C 15/04; G11C 11/413
(52) U.S. Cl. .................. 711/207; 711/108; 365/49; 365/210
(58) Field of Search ................. 711/108, 205, 711/207; 365/49, 210

(56) References Cited

U.S. PATENT DOCUMENTS

| | | | | |
|---|---|---|---|---|
| 5,289,403 A | * | 2/1994 | Yetter | 365/49 |
| 5,517,441 A | * | 5/1996 | Dietz et al. | 365/49 |
| 5,859,791 A | * | 1/1999 | Schultz et al. | 365/49 |
| 6,114,873 A | * | 9/2000 | Sahraoui et al. | 326/39 |
| 6,195,277 B1 | * | 2/2001 | Sywyk et al. | 365/49 |
| 6,230,236 B1 | * | 5/2001 | Schultz et al. | 711/108 |
| 6,240,000 B1 | * | 5/2001 | Sywyk et al. | 365/49 |

* cited by examiner

Primary Examiner—Glenn Gossage

(57) ABSTRACT

A self-timed translation lookaside buffer (TLB) is disclosed that utilizes a two-level match scheme to trigger the evaluation of whether a match is achieved for a received virtual address within the TLB. The first level is referred to as the local match, and the second level is referred to as the global match. An entry of a TLB comprises groups of bits, with each group coupled to a separate local match line. Each of the local match lines of an entry is coupled to a global match line, which is initially set to a high voltage level and discharges to a low voltage level if any of the local match lines indicate a mismatch for their respective group. Accordingly, when the global match lines are evaluated, if the global match line has a high voltage level it indicates that the associated TLB entry matches the virtual address, otherwise the global match line indicates a mismatch for the entry. Multiple global match lines are evaluated to trigger a memory access for a matching entry. More specifically, in a preferred embodiment, a pair of neighboring global match lines are input to a NAND gate, the output of which triggers the evaluation of whether a match is achieved for either entry.

18 Claims, 7 Drawing Sheets

SYSTEM AND METHOD FOR TLB BUDDY ENTRY SELF-TIMING

TECHNICAL FIELD

This invention relates in general to accessing memory of a computer system, and in particular to a method and system that provide a translation look-aside buffer (TLB) implementing a self-timed evaluation of whether a virtual address for a memory access request is found within the TLB, which reduces the latency involved in accessing the memory to satisfy the memory access request.

BACKGROUND

Computer systems may employ a multi-level hierarchy of memory, with relatively fast, expensive but limited-capacity memory at the highest level of the hierarchy and proceeding to relatively slower, lower cost but higher-capacity memory at the lowest level of the hierarchy. The hierarchy may include a relatively small, fast memory called a cache, either physically integrated within a processor or mounted physically close to the processor for speed. The computer system may employ separate instruction caches ("I-caches") and data caches ("D-caches"). In addition, the computer system may use multiple levels of caches. The use of a cache is generally transparent to a computer program at the instruction level and can thus be added to a computer architecture without changing the instruction set or requiring modification to existing programs.

Cache structures implemented for processors typically include a translation look-aside buffer (TLB), which is generally a large content addressable memory (CAM) structure. Generally, when an instruction being executed by the processor 19 (as shown in FIG. 2A) requests access to memory (e.g., to read from or write to an address), the cache's TLB receives a virtual address for such memory access request and translates the virtual address to a physical address. That is, the TLB translates a received virtual address to a physical address of the cache memory (e.g., random access memory (RAM)) to be accessed to satisfy the memory access request. More specifically, a TLB typically comprises multiple entries of addresses, and when the TLB receives a virtual address it compares the virtual address with its entries to determine if a match is made for the cache. If the TLB determines that a match is made for one of its entries, indicating that the requested address is contained in the cache, a WORD line is activated or fired (e.g., transitions from a low voltage value to a high voltage value) causing the appropriate physical address to be accessed in the cache memory (e.g., in the RAM memory). That is, if a match is made for a received virtual address within the TLB, then the TLB outputs the appropriate physical address and the WORD line is fired causing such physical address to be accessed in the cache data arrays (e.g., RAM memory) to satisfy the memory access request.

Therefore, the cache TLB is necessarily in the critical path (the path required for completing an instruction) for a memory access request. The TLB is a fundamental part of all microprocessors in that an access of the cache cannot begin for a memory access request until the physical address is obtained for such memory access request from the TLB. Therefore, it is very critical that a TLB executes as fast as possible. That is, because the TLB necessarily affects the speed at which an instruction can be satisfied, it is desirable to have the TLB implemented in a manner such that instructions requiring to access the cache can be satisfied in a timely manner (i.e., quickly). However, prior art TLB implementations result in an undesirably long time in evaluating whether a match exists for a received virtual address within the TLB. As a result, prior art TLB implementations consume an undesirably long time before firing the WORD line to access the appropriate physical address in the cache memory when a match occurs within the TLB. Therefore, prior art implementations require an undesirably long time to satisfy a memory access request.

Turning to FIG. 1, an example of a TLB CAM 10 of the prior art is shown. As shown, TLB CAM 10 comprises circuitry 12, which is the circuitry for a single bit of the TLB CAM 10. Such circuitry of a TLB CAM 10 is well-known in the art, and therefore will not be described in great detail herein. In the exemplary TLB CAM 10 of FIG. 1, such a TLB CAM comprises 128 entries with each entry having 52 bits. Thus, circuitry 12 would be duplicated 51 times to provide a 52-bit entry, and such a 52-bit entry would be duplicated 127 times to provide a 128 entry TLB. Because such a TLB CAM is commonly implemented as an array having 128 rows of entries and 52 columns, the TLB entries may be referred to herein as rows. It should be understood that in various implementations TLB CAM 10 may have any number of entries (rows) with each entry having any number of bits (columns). TLB CAM 10 may receive a 52-bit virtual address for a memory access request, and compare the virtual address with its entries to determine whether a match is achieved in the TLB CAM for the received virtual address. As further shown in FIG. 1, TLB CAM 10 comprises a MATCH line through each bit circuitry 12 of an entry. TLB CAM 10 comprises a separate MATCH line (not shown) for each of the 128 entries, and each MATCH line indicates whether a match is made for its corresponding entry and a received virtual address.

Generally, each bit of an entry has a field effect transistor (FET) that is used to indicate whether it matches a corresponding bit of a received virtual address. For example, bit circuitry 12 of FIG. 1 includes an N-channel field effect transfer (NFET) 26 that is coupled to the MATCH line for that entry. NFET 26 is implemented such that if the bit circuitry 12 of this entry fails to match the corresponding bit of a received virtual address, then the NFET 26 pulls the MATCH line for this entry low. That is, the MATCH line is initially at a high voltage level, and if all the bits of the entry match a received virtual address, then the MATCH line remains at a high voltage level to indicate that the corresponding entry matches the virtual address (i.e., that a "hit" is achieved for the virtual address in the corresponding entry). However, if one or more bits fail to match the received virtual address, then such mismatching bit(s) pull the MATCH line low, thereby indicating that a hit was not achieved for the virtual address in the corresponding entry. Because every bit of the TLB CAM 10 includes such an NFET 26, a very small NFET 26 is typically utilized to reduce the amount of surface area and cost required for implementing the TLB CAM 10. Therefore, each NFET 26 of the TLB's bits is typically capable of discharging the MATCH line at a relatively slow rate. That is, each NFET 26 is typically a small NFET that requires a relatively long time to discharge a MATCH line because of the parasitic capacitance on the MATCH line presented by the other cells coupled to such MATCH line. Although, if many bits of an entry all fail to match the virtual address, thereby causing many of such NFETs 26 to join in pulling down the MATCH line, such an entry is capable of discharging the MATCH line more quickly than an entry in which only a few bits fail to match the virtual address.

It should be recognized that it is desirable to determine the MATCH line value for each entry as soon as possible so as to allow the cache memory to be accessed to satisfy a memory access request in a timely manner. Therefore, it is desirable to evaluate the value of the MATCH lines for a TLB as soon as possible to decrease the time required to satisfy a memory access request. However, care must be taken to prevent the MATCH lines from being accessed prematurely (i.e., before an entry has completed pulling the MATCH line low for a mismatch) to avoid an erroneous access of a physical address in the cache memory. For example, suppose a match is achieved for a virtual address in a first entry of the TLB, and suppose a second entry of the TLB does not match the virtual address. If the MATCH lines are evaluated before the MATCH line for the second entry has had sufficient opportunity to discharge, the WORD line will fire causing an erroneous access of the physical address output by the second entry.

One implementation of the prior art dedicates one phase of a clock cycle to determining whether each entry in the TLB matches a received virtual address (to allow sufficient time for the MATCH line of each entry failing to match the virtual address to be discharged), and dedicates a later phase of a clock cycle to firing the WORD line to access the appropriate physical address in the cache memory (i.e., the physical address of a matching entry of the TLB). By dedicating a sufficiently long block of time for determining whether each entry in the TLB matches a received virtual address, this implementation avoids an erroneous memory access caused by evaluating the MATCH lines too early.

However, such prior art implementation requires an undesirably long time before the cache memory is accessed to satisfy a memory access request. For instance, if the TLB matching completes very quickly for a memory access request, this implementation does not begin the access of the cache memory (e.g., by firing the WORD line) any earlier. Thus, this implementation may result in wasted time in that a portion of time reserved for matching the entries of the TLB with a received virtual address may be unused. That is, because the circuitry is required to wait for a particular clock edge to occur before evaluating the TLB MATCH lines and accessing the appropriate physical address of the cache memory, the speed at which a memory access request can be satisfied is hindered. Thus, this prior art TLB implementation requires an undesirably long amount of time in the critical path for a memory access request. This implementation does not make efficient use of time to determine a match in the TLB entries, and therefore this implementation does not satisfy memory access requests in an efficient and timely manner. More specifically, this prior art design does not utilize a self-timing implementation for the TLB, but rather utilizes a predetermined timing sequence for the TLB. Accordingly, because this prior art design does not utilize a self-timing implementation for the TLB, it does not enable a fast TLB (i.e., a TLB that quickly determines whether a match is achieved for a received virtual address) to satisfy memory access requests efficiently and quickly.

A second implementation of the prior art utilizes a "dummy" row and "dummy" column in an attempt to satisfy memory access requests more efficiently. Turning to FIG. 2A, an example of this second implementation is illustrated. As shown, the TLB CAM 10 comprises 128 entries (or rows) each having 52 bits (or columns). In addition, TLB CAM 10 comprises a dummy row (shown as row 13) and a dummy column (shown as column 11). One bit of the dummy row 13 is tied to a MATCH line for the dummy row 13, and the remaining bits of the dummy row 13 are coupled to the MATCH line but are not enabled (e.g., are tied to ground). For example, the common bit of the dummy row 13 and dummy column 11, shown as bit 17, may be tied to a MATCH line for the dummy row 13, and the remaining bits of the dummy row 13 and dummy column 11 are coupled to the MATCH line but not enabled. As a result, a single NFET 26 pulls down the MATCH line for the dummy row 13, thereby providing a reference for when the evaluation of the MATCH lines for the actual entries of the TLB CAM can be performed. That is, the NFET 26 of bit 17 is implemented to pull down the MATCH line for the dummy row 13. Because a single bit mismatching for an entry will provide the slowest time for pulling the MATCH line to a low voltage level, the dummy row 13 having a single NFET 26 pulling the dummy row's MATCH line low provides a time reference that can be used for triggering the evaluation of the TLB's MATCH lines. Thus, by the time the dummy row's MATCH line is pulled low, the MATCH lines for every entry of the TLB should be set to their appropriate values. More specifically, by the time the dummy row's MATCH line is pulled low, every mismatching entry of the TLB should have completed discharging. Accordingly, rather than executing according to a predetermined time sequence, this prior art implementation utilizes a dummy row 13 to provide a reference time for triggering the evaluation of the TLB's MATCH lines. Thus, the evaluation of the TLB's MATCH lines will always be triggered based on the worst case for matching a virtual address within the TLB, i.e., the case in which only one bit of an entry fails to match the virtual address.

To further illustrate the operation of the prior art implementation of FIG. 2A, exemplary wave traces are shown in FIG. 2B. As clock 102 (e.g., the processor clock) goes high, the virtual address 104 is fired (e.g., received into the TLB CAM 10). When the virtual address 104 fires, the dummy MATCH line 110 for dummy row 13 is pulled low through a single NFET of bit 17. At some point after the dummy MATCH line 110 goes low, the self-timed path for evaluating the TLB's MATCH lines, shown as line 106 in FIG. 2B, is triggered (goes high). More specifically, detection circuitry 20 in FIG. 2A is used to detect the dummy MATCH line 110 falling. When detection circuitry 20 detects the dummy MATCH line 110 at a low voltage level, the detection circuitry 20 generates the evaluate signal 106 (e.g., causes the evaluate signal 106 to transition to a high voltage level). When the evaluate signal 106 goes high, the WORD line 108 is triggered. Once the WORD line 108 transitions high, the appropriate physical address of TLB RAM 15 is accessed to satisfy the memory access request.

Because the dummy row 13 provides a reference time for evaluating the TLB MATCH lines based on the worst possible case (i.e., only one bit failing to match a received virtual address), this prior art implementation requires an undesirably long time to trigger the self-timed path for evaluation 106. That is, this prior art implementation requires an undesirably long time before the MATCH lines of the TLB are evaluated to detect a match for a virtual address. Additionally, it is difficult to implement a dummy row 13 that closely models the operation of the actual TLB entries. The process, voltage and temperature (PVT) effects may vary within the TLB circuitry, which make modeling the actual TLB entries with a dummy row 13 difficult. More specifically, the dummy row implementation typically attempts to model an entry that is a relatively far distance away from the dummy row, thereby making such modeling difficult due to a skew presented over such distance by PVT effects. For example, in some implementations a dummy row is relied upon for modeling an entry that is approximately 1000 microns away. Therefore, it may be very difficult to implement a dummy column 11 and dummy row 13 that closely model a normal row and column in TLB CAM 10 due to different processing problems encountered within the TLB circuitry.

Because of the PVT effects and the difficulty in closely modeling a dummy row 13 and column 11 to a normal row and column of the TLB CAM 10, margin must be added to the critical path to ensure that an erroneous memory access does not occur because of evaluating the TLB's MATCH lines prematurely. Thus, an additional amount of delay is typically added into the self-time path to account for any other effects that might slow down the MATCH lines for the actual entries of the TLB CAM 10. For example, a delay is typically implemented after the dummy MATCH line 110 is detected at a low voltage before the self-time path 106 is triggered. Accordingly, an undesirably long amount of time is required for the critical path of a memory access request because of the undesirably long time required in determining a MATCH in the TLB CAM 10. Furthermore, the dummy row and dummy column implementation of FIG. 2A consumes an additional amount of surface area and incurs an additional cost because of the additional column and row that are implemented for the TLB CAM structure 10.

To further improve the speed of a TLB, various attempts have been made to implement a "buddy" self-timed TLB in which the neighboring MATCH lines within a TLB are utilized to trigger the evaluate. Such a "buddy" self-timed TLB is desirable in that the evaluate for a MATCH line is triggered based on a neighboring MATCH line that is relatively close in proximity. However, prior art attempts at implementing a buddy self-timed TLB have been unsuccessful. A prevalent problem in prior art self-timed TLB circuitry is avoiding an erroneous memory access when a disproportionate number of bits fail to match a virtual address with the TLB's entries. To illustrate this problem of a TLB self-timed circuit, attention is directed to FIG. 3 which illustrates a typical buddy self-timed implementation of the prior art. Shown in FIG. 3 is a first MATCH line, MATCH line A, which is used to indicate whether a match is achieved for a first 52-bit entry of a TLB. Accordingly, MATCH line A has 52 NFETs coupled to it; one for each bit of its corresponding entry. Also shown is a second MATCH line, MATCH line B, which is used to indicate whether a match is achieved for a second 52-bit entry of a TLB. Thus, MATCH line B also has 52 NFETs coupled to it. MATCH line A and MATCH line B are input to a NAND gate 302, which outputs a signal for triggering the evaluation of the TLB's MATCH lines. Of course, a TLB may have many entries (e.g., 128 entries) which each have a separate MATCH line, and all of such MATCH lines would be input with a neighboring MATCH line to NAND gate circuitry, such as NAND gate 302, to determine the evaluate signal for such MATCH lines. However, for simplicity in explaining this prior art implementation, only two entries of a TLB are illustrated in FIG. 3.

In operation, MATCH line A and MATCH line B will each initially have a high voltage value when a virtual address is received by the TLB. While both MATCH line A and MATCH line B have a high voltage value, the evaluate signal output by NAND gate 302 is a low voltage value. However, when either one of MATCH line A or MATCH line B goes to a low voltage value, the NAND gate 302 outputs a high voltage value for the evaluate signal, indicating that the MATCH lines of the TLB are ready to be evaluated and the WORD line fired to access the appropriate physical address of the cache. Suppose, for example, that when the TLB receives a virtual address, all 52 bits fail to match the virtual address of the first entry, resulting in 52 NFETs pulling down on MATCH line A. Further suppose that only one bit of the second entry fails to match the virtual address, resulting in one NFET pulling down on MATCH line B. Because 52 NFETs are discharging MATCH line A, while only one NFET is discharging MATCH line B, MATCH line A is discharged much faster than MATCH line B due to the parasitic capacitance present on MATCH line B. When MATCH line A discharges, it causes NAND gate 302 to trigger the evaluate signal prematurely. That is, MATCH line B has likely not discharged to a low voltage value when MATCH line A causes the NAND gate 302 to trigger the evaluate signal. Accordingly, when the evaluate signal goes high, the WORD line is erroneously fired to access the memory address for the second entry of the TLB because the MATCH line B has not completed its discharge yet. Therefore, a prevalent problem with prior art self-timed TLB circuits is the inherent skew in the time required for discharging TLB MATCH lines for entries having a disproportionate number of bits matching a received virtual address. As a result, an effective buddy self-timed TLB has not been developed in the prior art.

In view of the above, prior art TLB implementations are problematic for several reasons. First, prior art TLB implementations require an undesirably long time before accessing the cache memory to satisfy a memory access request, thereby resulting in an undesirably high latency in the cache. Furthermore, as prior art implementations attempt to decrease the time required for the TLB by utilizing buddy self-timed circuitry, erroneous memory addresses are accessed when a disproportionate number of bits between various TLB entries match a received virtual address. To avoid such erroneous memory address accesses, a dummy column and dummy row implementation is typically utilized for prior art TLBs. However, such a dummy column and dummy row implementation results in an undesirably long time before accessing the cache memory to satisfy a memory access request because the evaluate signal (which triggers the WORD line) is based on a reference time for the worst case matching scenario within the TLB (i.e., only a single bit failing to match the received virtual address). Furthermore, the dummy column and dummy row implementation consumes an undesirably large amount of surface area because it requires an additional column and row to be implemented, and it therefore results in increased cost in implementing the TLB. Additionally, the dummy row and dummy column implementation is problematic in that the dummy row is used to model an entry that is physically located relatively far away therefrom, which increases the skew in the model because of PVT effects.

SUMMARY OF THE INVENTION

In view of the above, a desire exists for a TLB implementation that does not require an undesirably long time in evaluating whether a match is achieved in the TLB for a virtual address before accessing the cache memory to satisfy the memory access request. A further desire exists for a TLB implementation that not only evaluates whether a match is achieved quickly, but also avoids access of erroneous memory addresses. A further desire exists for a TLB implementation that does not consume an undesirably large amount of surface area. Accordingly, a desire exists for a TLB that does not utilize a dummy column and dummy row for triggering the evaluation of whether a match is achieved in the TLB. Thus, a desire exists for a self-timed TLB that is capable of triggering an evaluation of whether a match is achieved in the TLB soon after the TLB entries have been compared with the virtual address to minimize the latency in accessing memory to satisfy a memory access request, while also avoiding accesses of erroneous memory addresses.

These and other objects, features and technical advantages are achieved by a system and method which provide a self-timed TLB that utilizes a two-level match scheme to trigger the evaluation of whether a match is achieved for a received virtual address within the TLB. The first level of the match scheme is referred to herein as the local match, and the second level of the match scheme is referred to herein as the global match. In a preferred embodiment, an entry of a TLB comprises groups of bits, with each group coupled to a separate local match line. The local match lines are initially set to a high voltage level, in a preferred embodiment, and if any bit within a group fails to match the corresponding bit of the virtual address, it pulls the local match line to a low voltage level. Additionally, in a preferred embodiment, each of the local match lines of an entry is coupled to a global match line. The global match line is initially set to a high voltage level, and if any of the local match lines indicate that their respective group fails to match a received virtual address (e.g., by the local match line having a low voltage level), then such a local match line causes the global match line to be pulled to a low voltage level. Accordingly, if the global match line has a high voltage level when the global match lines are evaluated, it indicates that the TLB entry associated with the global match line matches the received virtual address. However, if the global match line has a low voltage level when the global match lines are evaluated, it indicates that the TLB entry associated with the global match line fails to match the received virtual address.

For example, in a most preferred embodiment, a 52-bit TLB entry comprises four groups of bits, with each group having 13 bits. For instance, bits [1:13] form a first group, bits [14:26] form a second group, bits [27:39] form a third group, and bits [40:52] form a fourth group. Each of the groups are coupled to a local match line. For instance, each bit of the first group is coupled to a local match line A, each bit of the second group is coupled to a local match line B, each group of the third group is coupled to a local match line C, and each bit of the fourth group is coupled to a local match line D. In a most preferred embodiment, the local match lines are initially set to a high voltage level. When a virtual address is received in the TLB, each bit of each group is compared with the corresponding bit of the received virtual address. If one or more bits of a group fail to match the corresponding bits of the virtual address, then such mismatching bit(s) pull their respective local match line(s) to a low voltage level. Otherwise, the local match line for the group of bits remains at a high voltage level.

Furthermore, in a most preferred embodiment, each of the local match lines controls a FET that is coupled to the global match line for an entry of the TLB. Therefore, in a most preferred embodiment, four FETs are coupled to the global match line for an entry (i.e., one FET for each local match line). If one or more of the local match lines are at a low voltage level, indicating that their respective group(s) of bits failed to match the corresponding bits of the received virtual address, then such local match line(s) turn their FET(s) on to pull the global match line to a low voltage level. Otherwise the global match line for the TLB entry remains at a high voltage level.

In a preferred embodiment, one global match line triggers the evaluation of a neighboring global match line to determine whether a match is achieved for any entry. More specifically, in a preferred embodiment, two global match lines are input to a NAND gate, and the output of the NAND gate is utilized to trigger the evaluation of the two global match lines. In a preferred embodiment, only one entry in a TLB may match a received virtual address. Accordingly, at most, only one of the two global match lines will remain at a high voltage level, indicating a match with the received virtual address. Therefore, when at least one of the two global match lines transitions low, the output of the NAND gate transitions high to trigger an evaluation of the pair of global match lines.

A slight timing skew may be present between the two global match lines transitioning to a low voltage level, however, such a timing skew is very small in a preferred embodiment. One way in which a preferred embodiment minimizes such timing skew is by implementing local match lines that are associated with a group of bits of an entry. By implementing an entry of the TLB as multiple groups of bits, a largely disproportionate number of bits mismatching in any one group is avoided. For example, in a most preferred embodiment, each group of bits comprises 13 bits of the entry. Accordingly, the most disproportionate result that can occur in a most preferred embodiment is having 13 bits mismatching in one group and only one bit mismatching in another group. It will be recalled that in prior art implementations, a much more disproportionate result could occur, such as 52 bits mismatching for one entry and only 1 bit mismatching for another. Therefore, the local match of a preferred embodiment reduces the timing skew within the TLB circuitry because a large, disproportionate number of bits mismatching is curtailed.

Furthermore, the timing skew is reduced in a preferred embodiment because a relatively small number of FETs are implemented to pull down on the global match line for each entry. For example, in a most preferred embodiment, four NFETs are coupled to a global match line to pull down the global match line if the associated entry fails to match a received virtual address. Accordingly, the number of NFETs pulling down the global match lines for a pair of entries can not be very disproportionate. For instance, in a most preferred embodiment, the most disproportionate result is having four NFETs pulling down the global match line for one entry and only one NFET pulling down the global match line for another entry. Also, in a preferred embodiment, the global match line FETs are much larger than the FETs utilized in prior art implementations to pull down a match line for an entry (e.g., NFET 26 of FIG. 1). Because the global match line FETs are larger in a preferred embodiment, the global match line can be pulled down much faster with only a single FET, thereby reducing the gain (or skew) recognized by having more than one FET pulling down on the global match line. In view of the above, the time skew in determining a match for two entries of a TLB is minimized. Therefore, a preferred embodiment provides a TLB that utilizes a "buddy" self-timed evaluation of the TLB's global match lines to minimize the latency in accessing the cache memory.

It should be appreciated that a technical advantage of one aspect of the present invention is that a TLB implementation is provided that reduces the latency in accessing memory to satisfy a memory access request. A further technical advantage of one aspect of the present invention is that a TLB implementation is provided that utilizes a "buddy" self-timed evaluation of whether a match is achieved for a received virtual address in the entries of the TLB. As a result, a technical advantage of one aspect of the present invention is that a TLB implementation is provided that minimizes the time required for evaluating whether a match is achieved in the TLB for a virtual address, thereby minimizing the latency in accessing the cache memory to satisfy a memory access request. For instance, a preferred embodiment provides a "buddy" self-timed evaluation implementation for a TLB, wherein the evaluation of a MATCH line is triggered by another MATCH line in relatively close proximity thereto. A further technical advantage of one aspect of the present invention is that a TLB implementation is provided that evaluates whether a match is achieved in the TLB as soon as possible, but also in a manner that avoids access of erroneous memory addresses. It should also be appreciated that a technical advantage of one aspect of the present invention is that a TLB implementation is provided that does not consume an undesirably large amount of surface area. For instance, a TLB implementation is provided that does not require a dummy column and dummy row for triggering the evaluation of whether a match is achieved in the TLB.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
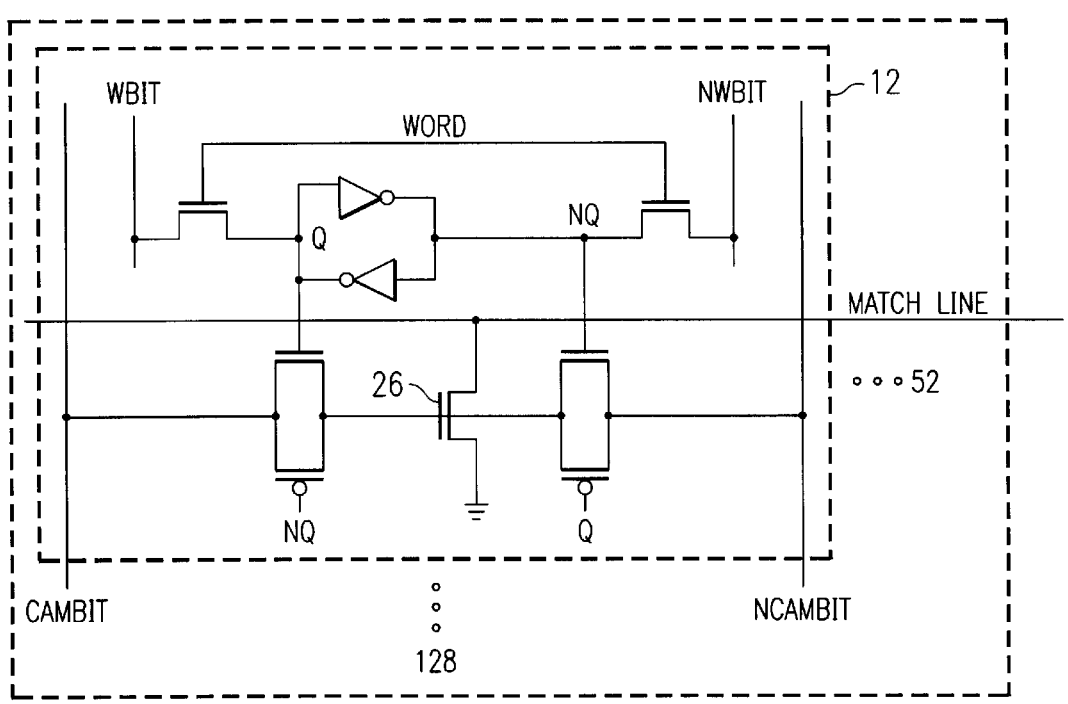
FIG. 1 shows an example of a prior art TLB implementation.
Figure 2A:
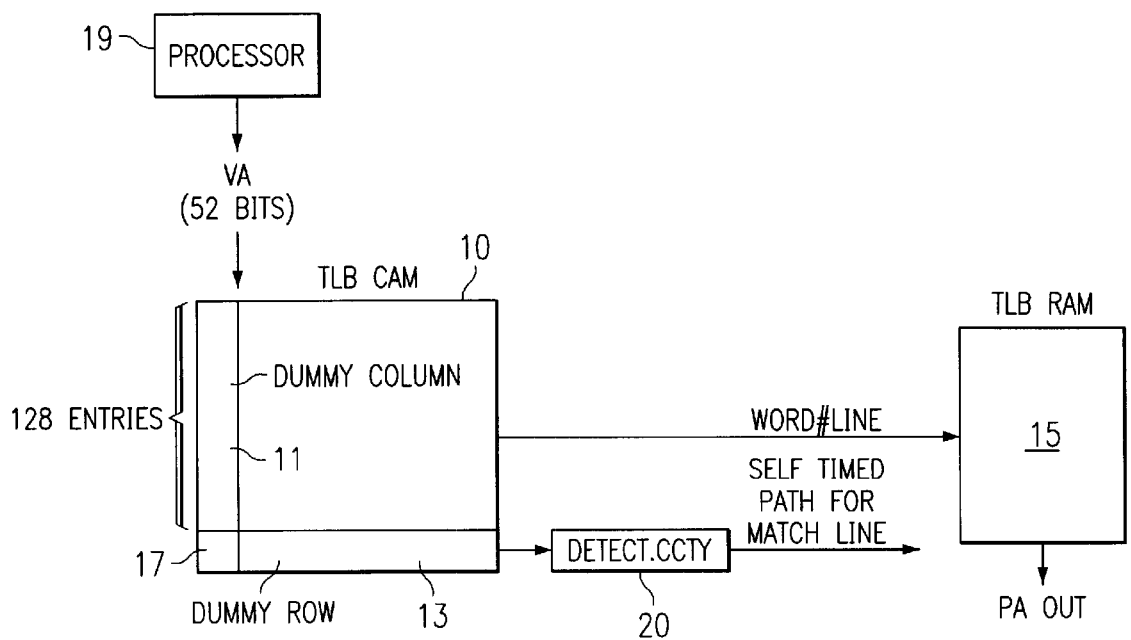
FIG. 2A shows another exemplary TLB implementation that utilizes a dummy row and dummy column.
Figure 2B:
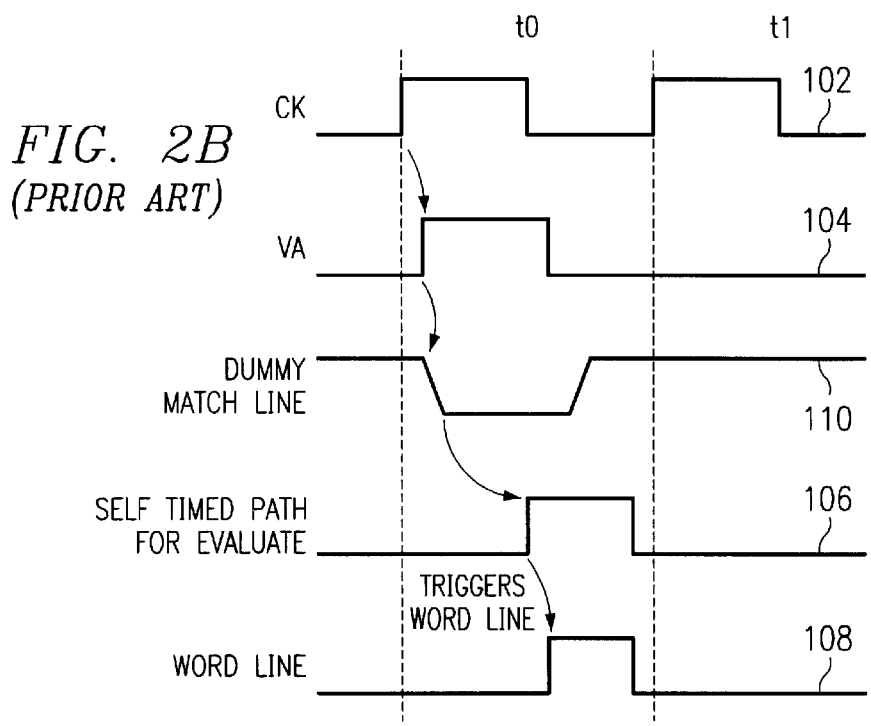
FIG. 2B shows exemplary wave traces for the prior art implementation of FIG. 2A.
Figure 3:
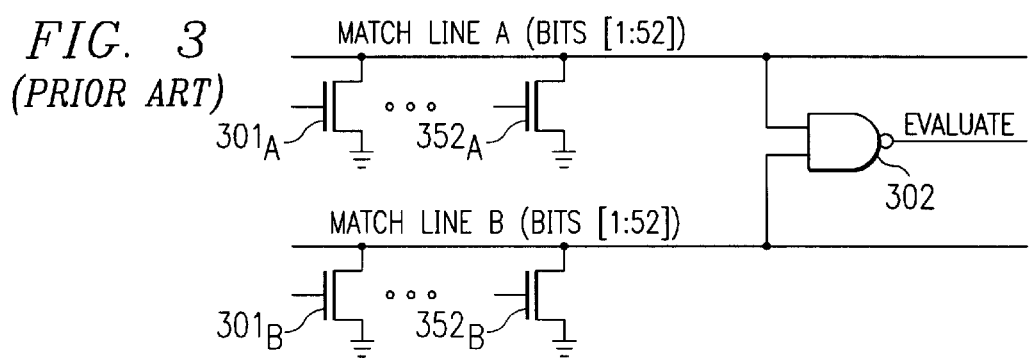
FIG. 3 shows a typical buddy self-timed implementation of the prior art.

A preferred embodiment of the present invention utilizes a "buddy" self-timed circuit for a TLB to provide a fast, efficient TLB. The buddy self-timed circuit for a TLB of a preferred embodiment is based on the fact that only one entry in such TLB can match a received virtual address during normal operation. During abnormal operation, such as during a PURGE operation, multiple entries of the TLB may match. However, in that case, one does not care whether multiple matches are detected, and in fact, detecting multiple matches is desired during such an operation. Thus, in a preferred embodiment, only one entry in a TLB matches a received virtual address during normal operation.

A preferred embodiment utilizes a two-level match detection scheme for the TLB. The first level, which is referred to herein as "local match," occurs as an n-channel metal oxide semiconductor (NMOS) static compare. Such a local match is evaluated by a delayed pulse clock in a preferred embodiment. Accordingly, in a preferred embodiment, there is no self-timing in the local match portion of the circuits. Therefore, if the local match line develops too slowly, the frequency of the part should be decreased. As will be discussed in greater detail hereafter, in a preferred embodiment an entry of the TLB comprises multiple groups of bits with each group having a local match line associated therewith. For example, in a most preferred embodiment, the TLB comprises entries that are 52 bits each, and each entry comprises four groups of 13 bits each (e.g., groups A, B, C, and D). Furthermore, each of the four groups has a local match line associated therewith (e.g., local match lines A, B, C, and D). When a virtual address is received in the TLB, each group of bits of an entry is compared with the corresponding bits of the virtual address to determine whether a match is achieved. In a preferred embodiment, each of the local match lines is initially set to a high voltage, and remain at a high voltage if a match is achieved for every bit of the entry. However, if a bit of a group fails to match with the corresponding bit of the virtual address, such bit pulls the local match line for its group low. For example, each bit of a group may comprise an NFET coupled to the local match line such that if a bit within the group fails to match with its corresponding bit of the virtual address, the bit's NFET pulls the local match line for the group to a low voltage value. Thus, in a preferred embodiment, multiple local match lines are implemented for each entry to indicate whether a portion of the entry matches with a received virtual address.

The second level, which is referred to herein as "global match," utilizes a cancellation gate type structure where the evaluate clock is generated by the buddy self-timed circuitry. In a preferred embodiment, each entry of the TLB has a global match line associated therewith. The multiple local match lines of an entry are utilized to control the global match line for such entry. For instance, in a preferred embodiment, each of the global match lines of a TLB is initially set to a high voltage value, and remains at a high voltage value if a match is achieved for its associated TLB entry. Each of the local match lines of an entry may be input to an NFET coupled to the global match line for the entry, wherein if a local match line indicates that its associated group of bits fails to match the corresponding bits of a virtual address, the NFET to which such local match line is input pulls down the global match line. For example, in a most preferred embodiment, an entry comprises four local match lines, which are utilized to control a single global match line for the entry. Accordingly, each of the four local match lines of an entry may control an NFET coupled to the global match line for the entry. Thus, four NFETs may be coupled to the global match line for the entry with a different local match line controlling each of the NFETs. If a local match line indicates that its associated group of bits fails to match the corresponding bits of the virtual address, such local match line turns on its NFET to pull down the global match line for the entry, thereby indicating that a match was not made for the entry.

In a preferred embodiment, entry pairs across the TLB generate their own self-timing evaluate signal based upon the adjacent entry's mismatching. That is, in a preferred embodiment, one buddy self-timed circuit is implemented per pair of entries of the TLB. Accordingly, when the global match line for one entry of the pair indicates that it fails to match the received virtual address, the self-timing evaluate signal for the pair is generated. It should be recognized that, in a preferred embodiment, both entries of the pair determine whether they match a received virtual address simultaneously (e.g., in parallel). Accordingly, approximately when one entry completes its determination (e.g., when one entry determines that it fails to match the received virtual address), the determination should be complete for the second entry of the pair. For instance, because only one entry in the TLB can match a received virtual address, when a mismatch is detected for one entry of a pair, the other entry should approximately be complete. Therefore, approximately upon one entry of the pair detecting a mismatch, the evaluate signal for the pair can be triggered.

Some slight, built-in skews in timing may exist in a preferred embodiment, which must be accounted for in the TLB circuitry. However, in a preferred embodiment, such skews are not as great as in prior art implementations. Such skews are not as great in the local match because an entry is divided into multiple groups of bits, which prevents such a largely disproportionate number of bits mismatching in any one group. For example, in a most preferred embodiment, each group of bits in an entry (each local match group) comprises 13 bits of the entry. Accordingly, the most disproportionate result that can occur is having 13 bits mismatching in one group and only one bit mismatching in another group. However, in prior art implementations, a much more disproportionate result could occur, such as 52 bits of the entry mismatching for one entry and only 1 bit mismatching for another. Therefore, the local match of a preferred embodiment reduces the timing skew within the TLB circuitry because a large, disproportionate number of bits mismatching is curtailed.

Furthermore, the timing skew is reduced in a preferred embodiment because a relatively small number of FETs are implemented to pull down on the global match line for each entry. For example, in a most preferred embodiment, four NFETs are coupled to a global match line to pull down the global match line if the associated entry fails to match a received virtual address. Accordingly, the number of NFETs pulling down the global match lines for a pair of entries can not be very disproportionate. For instance, in a most preferred embodiment, the most disproportionate result is having four NFETs pulling down the global match line for one entry and only one NFET pulling down the global match line for another entry. Also, in a preferred embodiment, the global match line FETs are much larger than the FETs utilized in prior art implementations to pull down a match line for an entry (e.g., NFET 26 of FIG. 1). Because the global match line FETs are larger in a preferred embodiment, the global match line can be pulled down much faster with only a single FET, thereby reducing the gain recognized by having more than one FET pulling down on the global match line. In view of the above, the time skew in determining a match for two entries of a TLB is minimized.

Figure 4B:
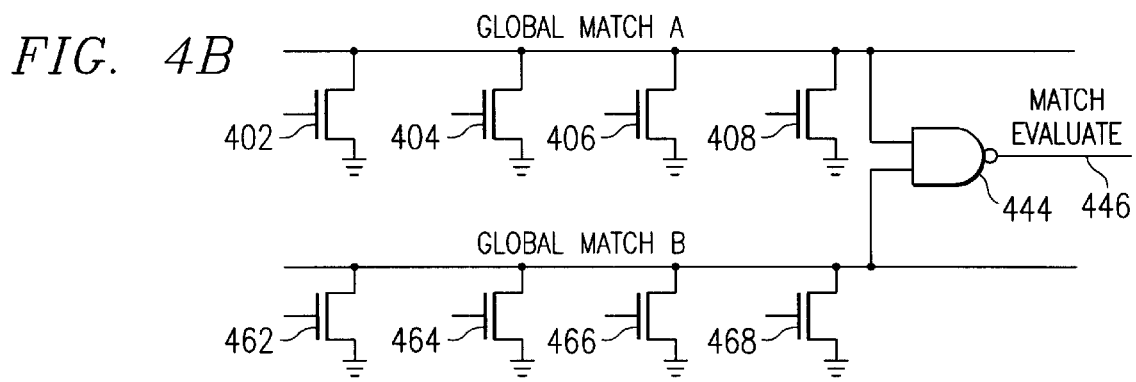
FIG. 4B shows an exemplary implementation of global match circuitry of a preferred embodiment.
Figure 4A:
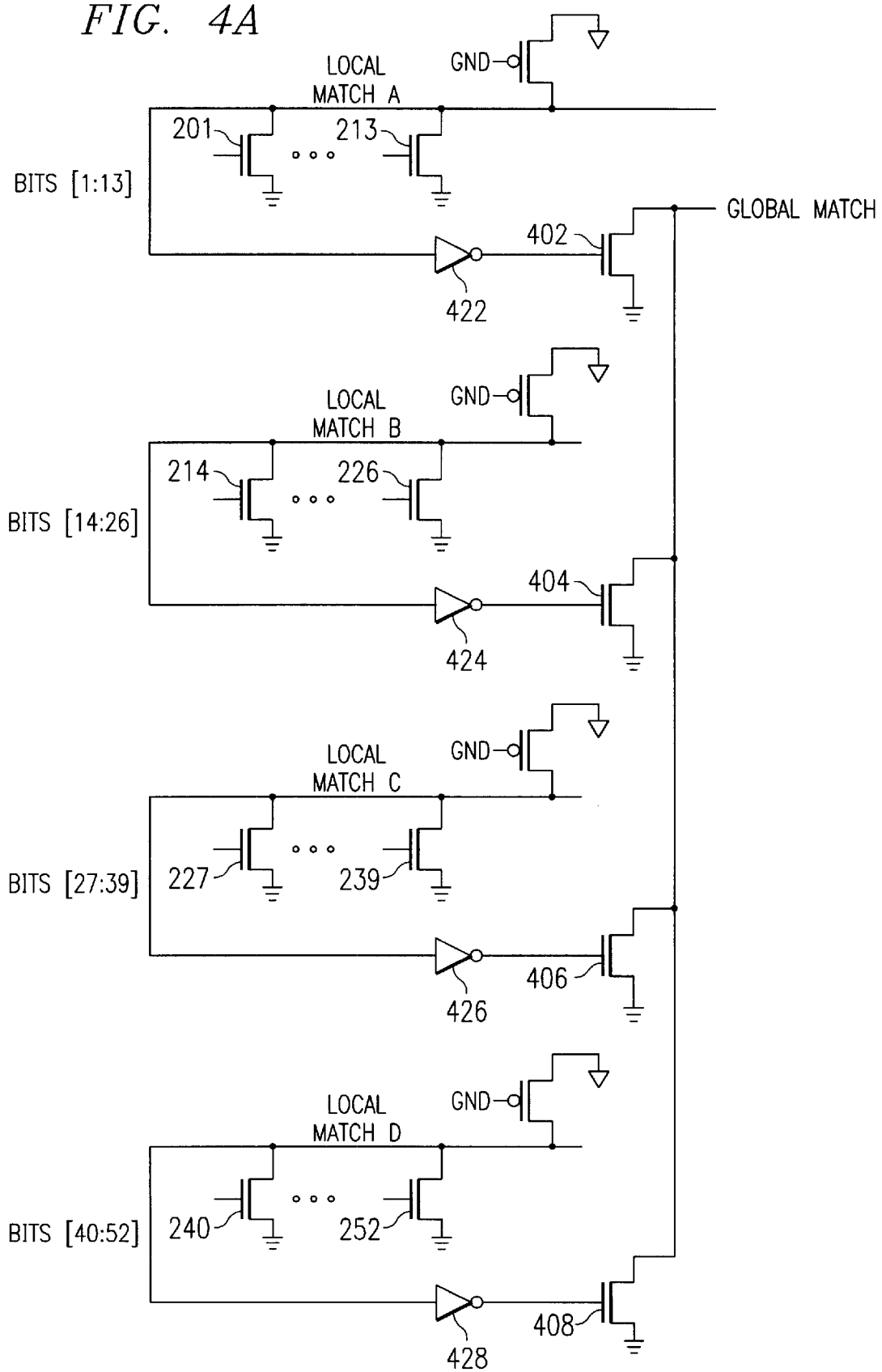
FIG. 4A shows an exemplary overview of compare circuitry for the local match of a preferred embodiment.
Figure 6A:
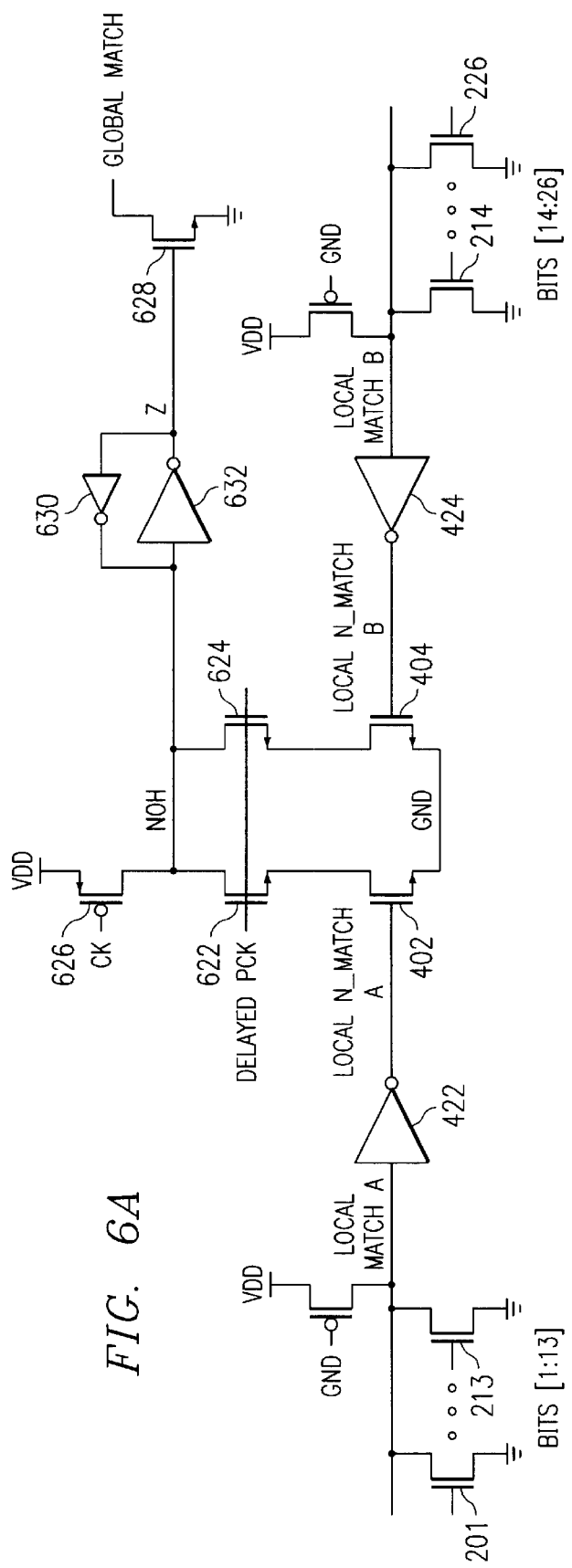
FIG. 6A shows an exemplary pseudo-static CAM structure compare circuitry that is used to detect a local match in a preferred embodiment.

Turning to FIG. 4A, an exemplary overview of the static pseudo NMOS compare circuitry for the local match of a preferred embodiment is shown. It should be understood that FIG. 4A provides an overview of a preferred embodiment for simplicity, and FIG. 6A provides an exemplary implementation of a preferred embodiment that is shown in greater detail. As shown in FIG. 4A, a 52-bit entry of the TLB comprises multiple groups of bits, wherein each group is associated with a local match line. For instance, in the exemplary implementation shown in FIG. 4A, an entry of the TLB is divided into four groups of bits. That is, an entry of the TLB comprises a first group of bits, bits [1:13], a second group of bits, bits [14:26], a third group of bits, bits [27:39], and a fourth group of bits, bits [40:52]. A local match line is associated with each of the four groups of bits of the entry. More specifically, local match line A is associated with bits [1:13], local match line B is associated with bits [14:26], local match line C is associated with bits [27–39], and local match line D is associated with bits [40–52]. It should be understood that the present invention is not intended to be limited only to a TLB having entries of 52 bits, as provided in this exemplary implementation, but instead is intended to encompass a TLB having entries of any size. Furthermore, the present invention is not intended to be limited to an entry comprising four groups of bits, but instead is intended to encompass a TLB entry comprising any number of groups of bits with each group comprising any number of bits therein. Thus, the exemplary implementation of FIG. 4A is intended as an example that renders the disclosure enabling for many other implementations for a TLB, and all of such other implementations are intended to be within the scope of the present invention.

When a virtual address is received in the TLB, each group of the entry of FIG. 4A is compared with the corresponding bits of the received virtual address to determine whether a match is achieved. Bits [1:13] of the entry each comprise an NFET, shown as NFETs 201 through 213, coupled to the local match line A, which are capable of pulling the local match line A to a low voltage value if any of the bits of the group [1:13] fail to match with the corresponding bit of the received virtual address. Also, bits [14:26] of the entry each comprise an NFET, shown as NFETs 214 through 226, coupled to the local match line B, which are capable of pulling the local match line B to a low voltage value if any of the bits of the group [14:26] fail to match with the corresponding bit of the received virtual address. Similarly, bits [27:39] of the entry each comprise an NFET, shown as NFETs 227 through 239, coupled to the local match line C, which are capable of pulling the local match line C to a low voltage value if any of the bits of the group [27:39] fail to match with the corresponding bit of the received virtual address. Likewise, bits [40:52] of the entry each comprise an NFET, shown as NFETs 240 through 252, coupled to the local match line D, which are capable of pulling the local match line D to a low voltage value if any of the bits of the group [40:52] fail to match with the corresponding bit of the received virtual address.

Local match lines A, B, C, and D control the NFETs 402, 404, 406, and 408, respectively. Each of NFETs 402, 404, 406, and 408 are coupled to the global match line for this entry. In a preferred embodiment, local match lines A, B, C, and D are initially set to a high voltage value when the TLB receives a virtual address. If all of the bits of their associated groups match the corresponding bits of the received virtual address, then local match lines A, B, C, and D remain high. However, if a bit of an associated group fails to match the corresponding bit of the received virtual address, then the associated match line A, B, C, or D is pulled to a low voltage value. If a local match line A, B, C, and D is at a high voltage value, then the NFET to which it is input (e.g., NFET 402, 404, 406, and 408, respectively) is turned off. In a preferred embodiment, the global match line for the entry is initially set to a high voltage value. Accordingly, if the NFETs 402, 404, 406, and 408 are all turned off, then the global match line remains at a high voltage value, indicating that a match has been achieved for this entry. However, if one or more of the local match lines A, B, C, and D is at a low voltage value, then the NFET(s) to which such one or more lines is input (e.g., NFET 402, 404, 406, and 408, respectively) is turned on, and such NFET(s) pull the global match line for the entry to a low voltage value, thereby indicating that a match was not achieved for the entry.

For example, when a virtual address is received in the TLB, bits [1:13] of the entry are compared with the corresponding bits [1:13] of the received virtual address to determine whether they match. If each bit matches, the local match line A remains at a high voltage value. Local match line A is input to an inverter 422, the output of which controls NFET 402. If the local match line A is at a high voltage value, the inverter 422 outputs a low voltage value, thereby turning NFET 402 off. If one or more of the bits [1:13] fail to match the corresponding bit of the received virtual address, then the appropriate FET(s) 201 through 213 pull the local match line A to a low voltage value. When the local match line A goes low, inverter 422 outputs a high voltage value, thereby turning NFET 402 on. When NFET 402 is turned on, it pulls the global match line for this entry to a low voltage value, thereby indicating that a match was not achieved for this entry. Accordingly, in a preferred embodiment, when the local match line A is high, NFET 402 does not pull the global match line low, and when the local match line A is low, NFET 402 pulls the global match line low.

The other bit groups of the entry function in a similar manner. For instance, bits [14:26] of the entry are compared with the corresponding bits [14:26] of the received virtual address to determine whether they match. If each bit matches, the local match line B remains high. Local match line B is input to an inverter 424, the output of which controls NFET 404. If the local match line B is at a high voltage value, the inverter 424 outputs a low voltage value, thereby turning NFET 404 off. If one or more of the bits [14:26] fail to match the corresponding bit of the received virtual address, then the appropriate FET(s) 214 through 226 pull the local match line B to a low voltage value. When the local match line B goes low, inverter 424 outputs a high voltage value, thereby turning NFET 404 on. When NFET 404 is turned on, it pulls the global match line for this entry to a low voltage value, thereby indicating that a match was not achieved for this entry. Accordingly, in a preferred embodiment, when the local match line B is high, NFET 404 does not pull the global match line low, and when the local match line B is low, NFET 404 pulls the global match line low.

In a similar manner, bits [27:39] of the entry are compared with the corresponding bits [27:39] of the received virtual address to determine whether they match. If each bit matches, the local match line C remains high. Local match line C is input to an inverter 426, the output of which controls NFET 406. If the local match line C is at a high voltage value, the inverter 426 outputs a low voltage value, thereby turning NFET 406 off. If one or more of the bits [27:39] fail to match the corresponding bit of the received virtual address, then the appropriate FET(s) 227 through 239 pull the local match line C to a low voltage value. When the local match line C goes low, inverter 426 outputs a high voltage value, thereby turning NFET 406 on. When NFET 406 is turned on, it pulls the global match line for this entry to a low voltage value, thereby indicating that a match was not achieved for this entry. Accordingly, in a preferred embodiment, when the local match line C is high, NFET 406 does not pull the global match line low, and when the local match line C is low, NFET 406 pulls the global match line low.

Likewise, bits [40:52] of the entry are compared with the corresponding bits [40:52] of the received virtual address to determine whether they match. If each bit matches, the local match line D remains high. Local match line D is input to an inverter 428, the output of which controls NFET 408. If the local match line D is at a high voltage value, the inverter 428 outputs a low voltage value, thereby turning NFET 408 off. If one or more of the bits [40:52] fail to match the corresponding bit of the received virtual address, then the appropriate FET(s) 240 through 252 pull the local match line D to a low voltage value. When the local match line D goes low, inverter 428 outputs a high voltage value, thereby turning NFET 408 on. When NFET 408 is turned on, it pulls the global match line for this entry to a low voltage value, thereby indicating that a match was not achieved for this entry. Accordingly, in a preferred embodiment, when the local match line D is high, NFET 408 does not pull the global match line low, and when the local match line D is low, NFET 408 pulls the global match line low.

In the exemplary implementation of a preferred embodiment shown in FIG. 4A, any one or more of the local match lines A, B, C, and D may be pulled to a low voltage value by a bit in the associated group mismatching with the corresponding bit of a received virtual address. Therefore, one or more of the NFETs 402, 404, 406, and 408 may be turned on to pull the global match line low for the entry. As discussed above, the timing skew discharging the global match line is minimized in that the number of FETs discharging two global match lines is not largely disproportionate because a relatively few number of FETs are implemented for each global match line, in a preferred embodiment. For instance, in the implementation shown in FIG. 4A, the most disproportionate result that can occur is one FET discharging a first global match line and four FETs discharging a second global match line. Of course, a greater number than four FETs may be implemented for a single global match line in other implementations. For example, twelve (or even more) FETs may be implemented for a single global match line without incurring such a timing skew that results in erroneous detection of hits for an entry. It should also be understood that a lesser number than four FETs may be implemented for a single global match line in other implementations (e.g., if an entry is divided into less than four groups of bits). Furthermore, in a preferred embodiment the NFETs 402, 404, 406, and 408 are larger than the NFETs typically utilized to discharge a match line in prior art implementations. For example, in a most preferred embodiment, each of NFETs 402, 404, 406, and 408 may be implemented as a 20 micron FET.

Turning to FIG. 4B, a preferred embodiment is further illustrated. In FIG. 4B, the global match line output by the entry of FIG. 4A is shown as global match line A. For instance, global match line A comprises four FETs coupled thereto, i.e., NFETs 402, 404, 406, and 408 of FIG. 4A. The global match line A is paired with a global match line of another entry of the TLB, which also has four FETs coupled thereto, i.e., NFETs 462, 464, 466, and 468. Preferably, the global MATCH lines A and B are for entries that are in relatively close proximity to each other. Most preferably, the global MATCH lines A and B are for neighboring entries. The paired global match lines (match line A and match line B) are input to a NAND gate 444, which outputs a match evaluate signal 446. As will be discussed in greater detail hereafter, match evaluate signal 446 indicates when it is appropriate to evaluate whether a match is achieved for the associated TLB entries of global match lines A and B, and fire the WORD line if a match is achieved within one of the entries. When both of the global match lines A and B are high, the NAND gate 444 outputs a low voltage value for the match evaluate signal 446. However, when one or both of the global match lines A and B transition low (indicating a mismatch for the associated entry), the NAND gate 444 outputs a high value for the match evaluate signal 446, thereby indicating that an evaluation of the match lines A and B can be performed. In a preferred embodiment, both entries are compared with the virtual address simultaneously (e.g., in parallel). Therefore, both match lines A and B should be read for evaluation at approximately the same time, given that the amount of skew in timing is minimized. Also, because only one entry in the TLB may match a received virtual address, at least one of the global match lines A and B must discharge to indicate a mismatch. Thus, at approximately the time that either one of the global match lines A and B transitions low, the other match line should be discharged if it also mismatches the received virtual address. Therefore, the match evaluation 446 may be utilized to trigger an evaluation of the global match lines A and B at approximately the time that the NAND gate 444 causes the match evaluation to transition high.

Figure 5:
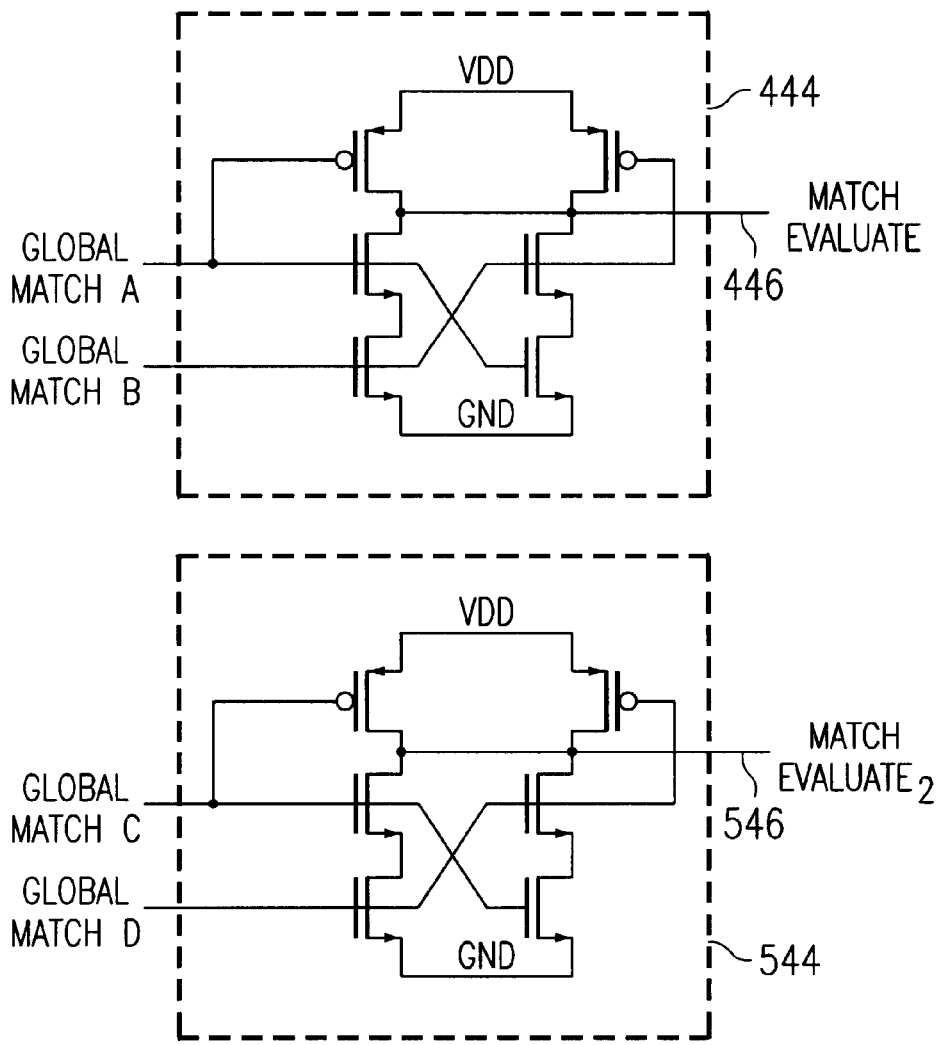
FIG. 5 shows an exemplary implementation of global match circuitry for two pairs of entries of a TLB in a preferred embodiment.

While FIG. 4B illustrates an implementation for one pair of entries of a TLB, it should be understood that many pairs of entries may exist in a TLB. Turning to FIG. 5, this point is illustrated with global match line circuitry implemented for two pairs of entries in a TLB. As with FIG. 4B, FIG. 5 includes a global match line A and global match line B that are each associated with an entry of the TLB. The global match line A and global match line B are most preferably neighboring MATCH lines that are input to a NAND gate 444, which is shown in greater detail in FIG. 5, and NAND gate 444 outputs a match evaluate signal 446 for the pair of global match lines. Additionally, global match line C and global match line D are associated with different entries of a TLB, which are also most preferably neighboring entries. Such global match lines C and D are input to a NAND gate 544, which outputs a match evaluate signal 546 for this pair of global match lines. As discussed above, most preferably the paired MATCH lines (e.g., MATCH lines A and B) are neighboring lines. However, in various implementations such paired MATCH lines may not be neighbors, but are preferably in relative close proximity to each other.

Turning to FIG. 6A, an exemplary pseudo-static CAM structure compare circuitry that is used to detect a local match in a preferred embodiment is shown. In a preferred embodiment, such a static CAM structure is included to compare a group of bits of an entry (e.g., bits [1:13] of an entry) with the corresponding bits of a received virtual address. Such a static CAM structure is a common device that is well-known in the art. Local MATCH lines A and B, which correspond to the local MATCH lines A and B of FIG. 4A, are shown. It should be understood that various other local MATCH lines (e.g., local MATCH lines C and D of FIG. 4A) may be implemented in a manner as shown in FIG. 6A. Consistent with FIG. 4A, local MATCH line A has 13 NFETs 201 through 213 coupled thereto to enable any one or more of the bits [1:13] of a corresponding entry to discharge the local MATCH line A if a mismatch is detected for any such bit. The local MATCH line A is input to an inverter 422, which outputs the inverse of local MATCH line A, shown as local N_MATCH A. Local N_MATCH A is input to NFET 402. Also, local MATCH line B has 13 NFETs 214 through 226 coupled thereto to enable any one or more of the bits [14:26] of a corresponding entry to discharge the local MATCH line B if a mismatch is detected for any such bit. The local MATCH line B is input to an inverter 424, which outputs the inverse of local MATCH line B, shown as local N_MATCH B. Local N_MATCH B is input to NFET 404.

As shown in FIG. 4A, NFETs 402 and 404 are used to discharge the global match line if either (or both) MATCH lines A and B fail to match a received virtual address. In a preferred embodiment, as shown in greater detail in FIG. 6A, a delayed pulse clock signal (delayed "PCK" or "DPCK") is used for detecting a local match. As shown in FIG. 6A, the DPCK signal is input to control NFETs 622 and 624, for local MATCH lines A and B, respectively. Also, a clock signal ("CK") is input to control a P-channel field effect transistor (PFET) 626, in a preferred embodiment. Furthermore, cross-coupled inverters 630 and 632 are included in a preferred embodiment to provide a latch for holding an output value "Z" to control NFET 628 for discharging the global match line if any of the local match lines coupled thereto signal a mismatch.

Figure 6B:
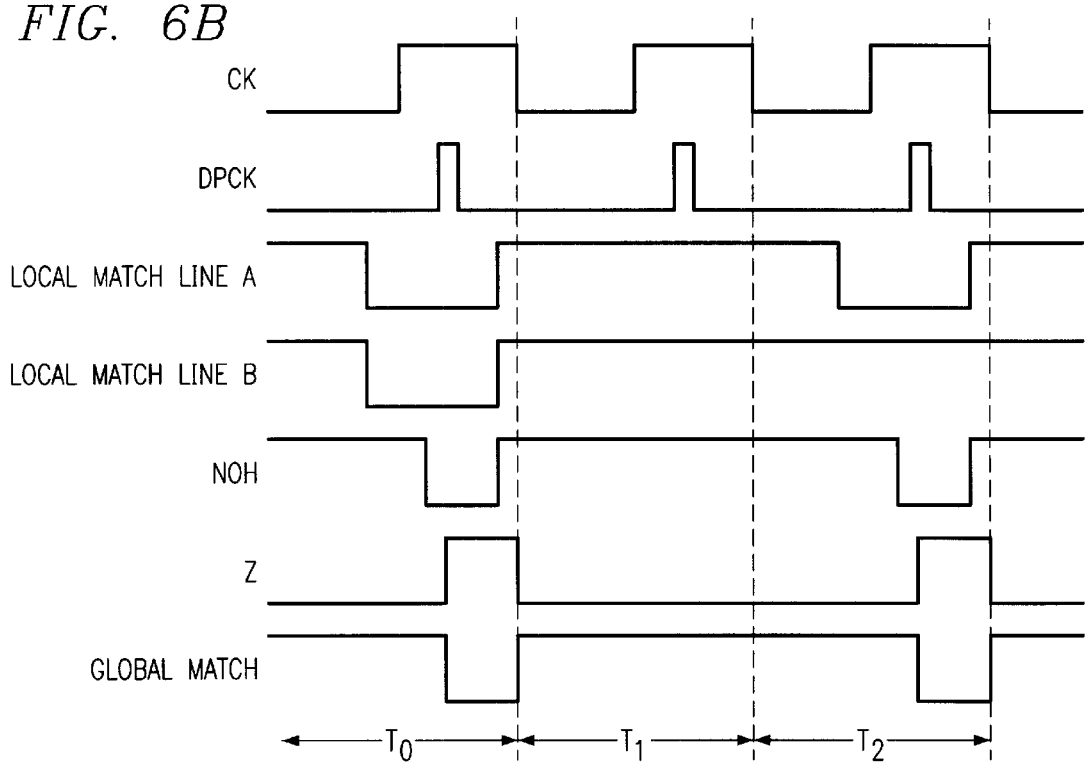
FIG. 6B shows exemplary wave forms illustrating the operation of the preferred embodiment of FIG. 6A.

Operation of the preferred embodiment of FIG. 6A is illustrated by the exemplary wave forms of FIG. 6B. Turning to FIG. 6B, exemplary wave forms are shown for the CK, DPCK, local MATCH line A, local MATCH line B, NOH, Z, and the global match line signals of FIG. 6A. During time period $T_0$, CK transitions high, and at some time thereafter, DPCK pulses high. The amount of delay after CK fires before firing DPCK is a set time that is long enough to allow the local MATCH lines A and B to be discharged by their corresponding NFETs (e.g., NFETs 201–213 and 214–226) if a mismatch occurs for the corresponding bits of the local MATCH lines. In a preferred embodiment, such a delay is a relatively short period of time because, as discussed above, a preferred embodiment enables the local MATCH lines to be discharged relatively quickly by one or more NFETs coupled thereto. As shown for time period $T_0$, local MATCH lines A and B are discharged to a low voltage value (indicating a mismatch for their corresponding bits) before the DPCK pulse signal is fired. In fact, in a preferred embodiment the local MATCH lines A and B are static signals which may discharge even before the CK signal transitions high. Because the local MATCH lines A and B are discharged to a low voltage value during time period $T_0$ (indicating a mismatch), the local N_MATCH A and local N_MATCH B signals output by inverters 422 and 424 are high voltage levels (i.e., logic 1). Accordingly, when the DPCK pulse fires, the NFETs 402 and 622 as well as NFETs 404 and 624 are turned on, thereby discharging NOH to a low voltage level, which is latched in the cross coupled inverters 630 and 632. As a result, signal Z (the output of inverter 632) is a high voltage level, which turns on NFET 628, thereby discharging the global MATCH line to a low voltage level. Thus, because a mismatch occurred for the local MATCH signals A and B, the global MATCH signal is discharged to indicate a mismatch for the entry.

During time period $T_1$, CK again transitions high, and at some time thereafter, DPCK pulses high. Again, the amount of delay after CK fires before firing DPCK is a set time that is long enough to allow the local MATCH lines A and B to be discharged by their corresponding NFETs (e.g., NFETs 201–213 and 214–226) if a mismatch occurs for the corresponding bits of the local MATCH lines. As shown in time period $T_1$, local MATCH lines A and B remain at a high voltage value (indicating a match for their corresponding bits). Because the local MATCH lines A and B remain at a high voltage level during time period $T_1$ (indicating a match), the local N_MATCH A and local N_MATCH B signals output by inverters 422 and 424 are low voltage levels (i.e., logic 0). Accordingly, when the DPCK pulse fires, the NFETs 402 and 404 remain turned off, thereby allowing the NOH signal to remain at a high voltage level, which is latched in the cross coupled inverters 630 and 632. As a result, signal Z (the output of inverter 632) is a low voltage level, which does not turn on NFET 628, thereby allowing the global MATCH line to remain at a high voltage level (indicating a match for the entry). Thus, because the bits coupled to local MATCH lines A and B match a received virtual address, the global MATCH signal is not discharged, thereby indicating a match for the entry. It should be understood, therefore, that if all of the local MATCH lines of an entry (e.g., local MATCH lines A, B, C, and D of FIG. 4A) indicate a match, then the global match line is not discharged by any of such MATCH lines coupled thereto.

During time period $T_2$, CK again transitions high, and at some time thereafter, DPCK pulses high. Again, the amount of delay after CK fires before firing DPCK is a set time that is long enough to allow the local MATCH lines A and B to be discharged by their corresponding NFETs (e.g., NFETs 201–213 and 214–226) if a mismatch occurs for the corresponding bits of the local MATCH lines. As shown for time period $T_2$, local MATCH line B remains at a high voltage value (indicating a match for its corresponding bits), but local MATCH line A transitions to a low voltage value (indicating a mismatch for its corresponding bits). Because the local MATCH line B remains at a high voltage level during time period $T_2$, the local N_MATCH B signal output by inverter 424 is a low voltage level (i.e., logic 0). Therefore, when the DPCK signal is fired, the NFET 404 is not turned on to discharge the NOH signal. However, because the local MATCH line A discharges to a low voltage level during time period $T_2$ (indicating a mismatch), the local N_MATCH A signal output by inverter 422 is a high voltage level (i.e., logic 1). Accordingly, when the DPCK pulse fires, the NFET 402 is turned on, thereby discharging the NOH signal to a low voltage level, which is latched in the cross coupled inverters 630 and 632. As a result, signal Z (the output of inverter 632) is a high voltage level, which turns on NFET 628, thereby discharging the global MATCH line to a low voltage level (indicating a mismatch for the entry). Thus, any one of the local match lines coupled to the global MATCH line is capable of discharging the global MATCH line if the local MATCH line's corresponding bits fail to match a received virtual address.

In a preferred embodiment, the evaluate signal for a pair of global match lines (e.g., signal 446 of FIG. 4A) is input to global match line detection circuitry. Turning to FIG. 7A, exemplary global match line detection circuitry of a preferred embodiment is shown. FIG. 7A reiterates that in a preferred embodiment a pair of global match lines (i.e., global match lines A and B) are input to a NAND gate 444, which outputs a match evaluate signal 446 for the pair. FIG. 7A further illustrates in greater detail the implementation of global match line A in a preferred embodiment. As shown, global match line A corresponds to the global match line of FIG. 4A, wherein local MATCH lines A, B, C, and D are coupled to the global MATCH line A via NFETs 402, 404, 406, and 408, respectively. A PRECK signal, which is a delayed clock signal, is provided to control PFET 714 and NFET 702. More specifically, when PRECK is low, PFET 714 is turned on to hold the global match line A to a high voltage level, and when PRECK transitions high, PFET 714 is turned off to allow the global match line A to be discharged if a mismatch is detected for one or more of the local MATCH lines coupled thereto. Additionally, when PRECK transitions high it turns on NFET 702. The match evaluate signal 446 for the pair of global match lines is input to control NFET 704. Additionally, the global match line A is input to control PFET 708 and NFET 706, which operate in conjunction with NFETs 702 and 704 to control the value of the NRWORD A signal. The NRWORD A signal is latched by the cross-coupled inverters 710 and 712, and the output of inverter 712 provides signal RWORD A, which is used to trigger an access (e.g., read operation) of the address specified by the TLB entry corresponding to global match line A.

Figure 7B:
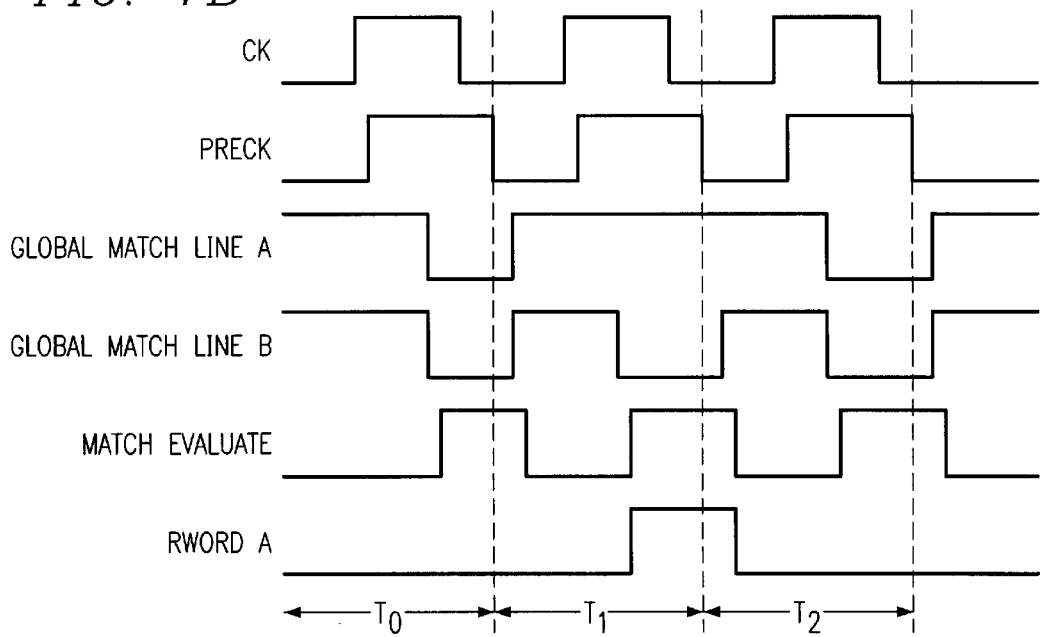
FIG. 7B shows exemplary wave forms illustrating the operation of the preferred embodiment of FIG. 7A.
Figure 7A:
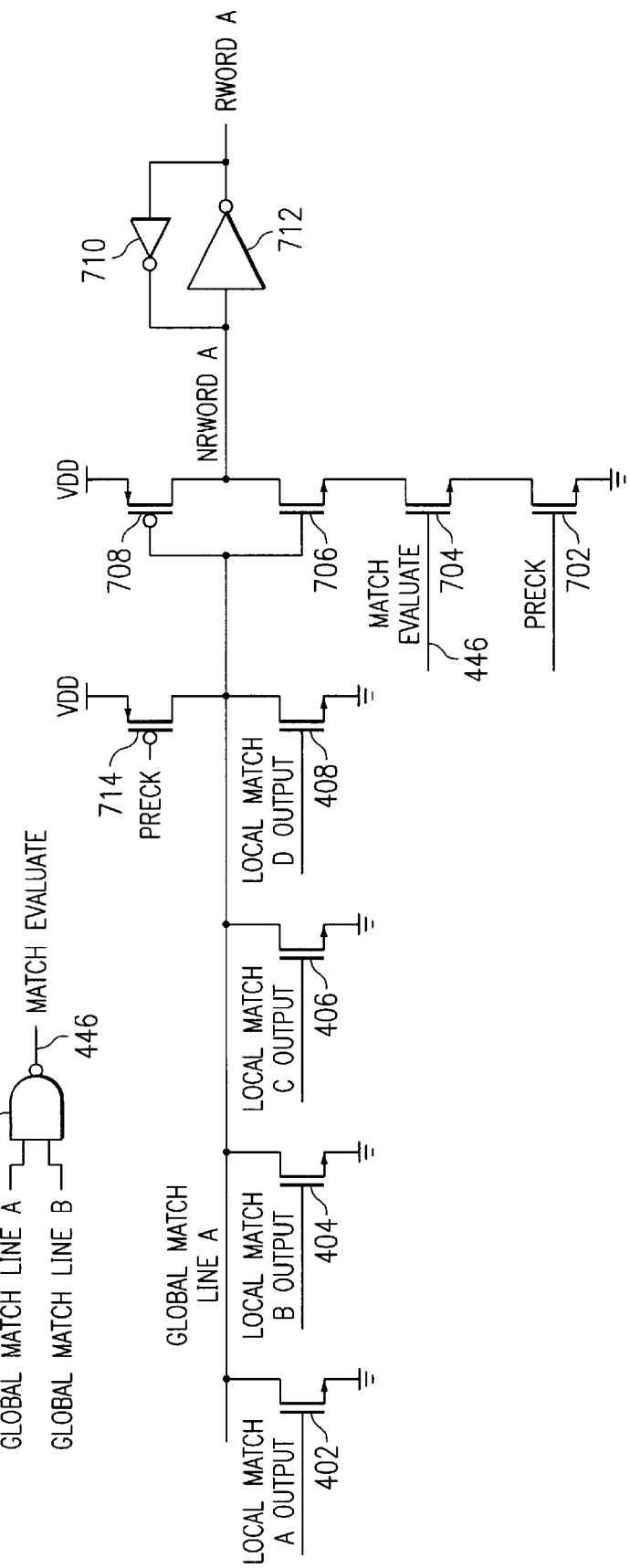
FIG. 7A shows exemplary global match line detection circuitry of a preferred embodiment.

Operation of the preferred embodiment of FIG. 7A is illustrated by the exemplary wave forms of FIG. 7B. Turning to FIG. 7B, exemplary wave forms are shown for the CK, PRECK, global match line A, global match line B, match evaluate, and the RWORD A line signals of FIG. 7A. During time period $T_0$, CK transitions high, and at some time thereafter, PRECK transitions high. As shown for time period $T_0$, after PRECK transitions high, global match lines A and B discharge to a low voltage value (indicating a mismatch for their corresponding local match lines). More specifically, PRECK transitions high turning PFET 714 off and turning NFET 702 on. One or more of NFETs 402, 404, 406, and 408 discharge global match line A to a low voltage value because their respective local MATCH lines indicate a mismatch. Because both global match lines A and B are initially high, match evaluate 446 output by NAND gate 444 is initially a low voltage value. Therefore, NFET 702 is initially turned off. When the global match line A signal is pulled low by NFETs 402, 404, 406, and/or 408, the match evaluate signal 446 transitions high, thereby turning on NFET 704. Additionally, because the global match line A is a low voltage value, NFET 706 is not turned on. Therefore, the NRWORD A signal remains pulled up to a high voltage value, which is latched in the cross-coupled inverters 710 and 712. Therefore, the RWORD A signal output by inverter 712 is a low voltage value, indicating that a memory access (e.g., read operation) is not to be triggered for the address of the TLB entry of global match line A. As shown in FIG. 7B, a mismatch also occurs for global match line B during time period $T_0$, which would occur in a similar manner as discussed above for global match line A.

During time period $T_1$, CK again transitions high, and at some time thereafter, PRECK transitions high. As shown for time period $T_1$, after PRECK transitions high, global match line B discharge to a low voltage value (indicating a mismatch for its corresponding local match lines), but global match line A remains at a high voltage value (indicating a match for its corresponding local match lines). For global match line A, when PRECK transitions high it turns PFET 714 off and turns NFET 702 on. None of NFETs 402, 404, 406, and 408 discharge global match line A to a low voltage value because their respective local MATCH lines all indicate a match. Because both global match lines A and B are initially high, match evaluate 446 output by NAND gate 444 is initially a low voltage value. Therefore, NFET 702 is initially turned off. When the global match line B signal is pulled low by the NFETs coupled thereto (indicating a mismatch for one or more of its associated local match lines), the match evaluate signal 446 transitions high, thereby turning on NFET 704. Additionally, because the global match line A is a high voltage value, NFET 706 is turned on. Therefore, the NFETs 706, 704, and 702 operate to discharge the NRWORD A signal to a low voltage value, which is latched in the cross-coupled inverters 710 and 712. Therefore, the RWORD A signal output by inverter 712 is a high voltage value, triggering a memory access (e.g., read operation) for the address of the TLB entry of global match line A. Therefore, the match for the entry associated with the global match line A is detected very quickly and enables an access of the corresponding address to be triggered in a timely manner.

During time period $T_2$, CK again transitions high, and at some time thereafter, PRECK transitions high. As shown for time period $T_2$, after PRECK transitions high, global match lines A and B discharge to a low voltage value (indicating a mismatch for their corresponding local match lines). More specifically, PRECK transitions high turning PFET 714 off and turning NFET 702 on. One or more of NFETs 402, 404, 406, and 408 discharge global match line A to a low voltage value because their respective local MATCH lines indicate a mismatch. Because both global match lines A and B are initially high, match evaluate 446 output by NAND gate 444 is initially a low voltage value. Therefore, NFET 702 is initially turned off. When the global match line A signal is pulled low by NFETs 402, 404, 406, and/or 408, the match evaluate signal 446 transitions high, thereby turning on NFET 704. Additionally, because the global match line A is a low voltage value, NFET 706 is not turned on. Therefore, the NRWORD A signal remains pulled up to a high voltage value, which is latched in the cross-coupled inverters 710 and 712. Therefore, the RWORD A signal output by inverter 712 is a low voltage value, indicating that a memory access (e.g., read operation) is not to be triggered for the address of the TLB entry of global match line A. As shown in FIG. 7B, a mismatch also occurs for global match line B at time period $T_2$, which would occur in a similar manner as discussed above for global match line A.

Figure 8:
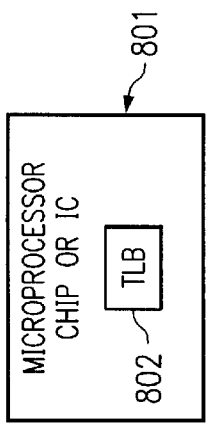
FIG. 8 depicts a processor connected to a TLB implemented according to embodiments of the present invention.

In a most preferred embodiment, as depicted in FIG. 8, the TLB circuitry 802 is implemented for the cache on a microprocessor chip (integrated circuit) 801. However, it should be understood that the TLB circuitry of a preferred embodiment may be implemented on any type of chip (integrated circuit) utilizing a TLB. Furthermore, it should be understood that a preferred embodiment may be implemented within any type of computer system having a processor, including but not limited to a personal computer (PC), laptop computer, and personal data assistant (e.g., a palmtop PC).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of accessing memory to satisfy a memory access request, said method comprising the steps of:
   receiving a virtual address for a memory access request in a translation look-aside buffer (TLB);
   comparing said virtual address with a first group of bits of an entry of said TLB;
   generating a first local match signal for said first group of bits indicating whether a match is achieved for said first group of bits and said virtual address;
   generating a global match signal for said entry of said TLB indicating whether a match is achieved for said entry as indicated by said first local match signal;
   accessing a physical address of memory indicated by said entry if said global match signal indicates a match is achieved for said entry; and
   triggering an evaluation of multiple global match signals based upon at least one of said multiple global match signals indicating that a match is not achieved for its respective entry.

2. The method of claim 1, wherein said multiple global match signals are a pair of global match signals.

3. The method of claim 1 wherein said triggering step further comprises the steps of:
   inputting said multiple global match signals into a NAND gate; and
   triggering an evaluation of said multiple global match signals based upon the output of said NAND gate.

4. The method of claim 1 wherein the generating of at least a first local match signal comprises generating multiple local match signals, each for a different group of bits of said entry.

5. The method of claim 1 wherein said multiple global match signals are communicated via global match lines that are relatively close in proximity to each other.

6. The method of claim 5 wherein said multiple global match lines are neighboring match lines.

7. The method of claim 1 wherein said comparing step comprises comparing said virtual address with multiple groups of bits of said entry.

8. The method of claim 7 wherein said entry is a 52-bit entry and said multiple groups comprises at least four groups of bits of said entry.

9. An integrated circuit comprising:
   a translation look-aside buffer (TLB) for translating a virtual address for a memory access request into an appropriate physical address of memory capable of satisfying said memory access request, said TLB comprising:
   means for comparing a first group of bits of an entry of said TLB with corresponding bits of a received virtual address, said means for comparing comprising:
      means for generating a first local match signal on a first local match line that indicates whether said first group of bits of said entry of said TLB matches said corresponding bits of said received virtual address; and
      means for generating a global match signal on a global match line for said entry of said TLB that indicates whether said entry matches said received virtual address; and
   means for triggering an evaluation of another global match signal associated with an adjacent global match line when said global match signal indicates that a match is not achieved for said entry.

10. The integrated circuit of claim 9 wherein said means for generating a first local match signal comprises a field effect transistor (FET) coupled to said first local match line for each bit of said first group of bits, wherein the FET for each bit of said first group of bits that fails to match the corresponding bit of said received virtual address pulls said first local match line to a low voltage level.

11. The integrated circuit of claim 10 wherein said first local match line is set to a high voltage level unless at least one bit of said first group of bits fails to match the corresponding of said received virtual address.

12. The integrated circuit of claim 9 further comprising:

means for comparing a second group of bits of said entry of said TLB with corresponding bits of said received virtual address, wherein said means for comparing a second group of bits includes means for generating a second local match signal on a second local match line that indicates whether said second group of bits of said entry of said TLB matches said corresponding bits of said received virtual address.

13. The integrated circuit of claim 12 wherein said means for generating a second local match signal comprises a field effect transistor (FET) coupled to said second local match line for each bit of said second group of bits, wherein the FET for each bit of said second group of bits that fails to match the corresponding bit of said received virtual address pulls said second local match line to a low voltage level.

14. The integrated circuit of claim 13 wherein said second local match line is set to a high voltage level unless at least one bit of said second group of bits fails to match the corresponding bit of said received virtual address.

15. The integrated circuit of claim 12 wherein said means for generating a global match signal comprises a field effect transistor (FET) coupled to said global match line for each of said first local match line and said second local match line, wherein the FET for each of said first local match line and said second local match line that indicate that their respective group of bits fail to match the corresponding bits of said received virtual address pulls said global match line to a low voltage level.

16. The integrated circuit of claim 15 wherein said global match line is set to a high voltage level unless at least one of said first local match line and said second local match line indicates that its respective group of bits fails to match the corresponding bits of said received virtual address.

17. A system comprising:

at least one processor for executing instructions;

memory accessible by said at least one processor to satisfy an instruction requesting access to said memory;

a translation look-aside buffer (TLB) that receives a virtual address for a memory access request and translates said virtual address into an appropriate physical address of said memory capable of satisfying said memory access request;

said TLB comprising multiple entries, wherein each entry of said multiple entries comprises at least a first group of bit circuitry and a second group of bit circuitry, each bit circuitry of said first group of bit circuitry coupled to a first local match line to indicate on said first local match line whether each bit corresponding to said first group of bit circuitry matches a respective corresponding bit of a received virtual address, and each bit circuitry of said second group of bit circuitry coupled to a second local match line to indicate on said second local match line whether each bit corresponding to said second group of bit circuitry matches a corresponding bit of said received virtual address, wherein said first local match line and said second local match line selectively pull-down a global match line to indicate on said global match line whether a respective entry matches said received virtual address, and wherein said global match line is coupled to a logical element that is operable to trigger evaluation of the entry associated with the global match line and at least one other entry associated with another global match line.

18. The system of claim 17 wherein each bit circuitry of said first group of bit circuitry is coupled to said first local match line via a field effect transistor (FET), each bit circuitry of said second group of bit circuitry is coupled to said second local match line via a FET, and each of said first local match line and said second local match line is coupled to said global match line via a FET.

* * * * *